United States Patent
Park et al.

(10) Patent No.: US 11,728,225 B2
(45) Date of Patent: Aug. 15, 2023

(54) MICRO LED VERIFICATION SUBSTRATE, MANUFACTURING METHOD THEREFOR, AND MICRO LED VERIFICATION METHOD USING SAME

(71) Applicant: Research Cooperation Foundation of Yeungnam University, Gyeongsan-si (KR)

(72) Inventors: Si Hyun Park, Daegu (KR); Young Woong Lee, Daegu (KR)

(73) Assignee: Research Cooperation Foundation of Yeungnam University, Gyeongsangbuk-do (KR)

(*) Notice: Subject to any disclaimer, the term of this patent is extended or adjusted under 35 U.S.C. 154(b) by 314 days.

(21) Appl. No.: 17/041,598

(22) PCT Filed: Mar. 19, 2019

(86) PCT No.: PCT/KR2019/003119
§ 371 (c)(1),
(2) Date: Sep. 25, 2020

(87) PCT Pub. No.: WO2019/190102
PCT Pub. Date: Oct. 3, 2019

(65) Prior Publication Data
US 2021/0028074 A1     Jan. 28, 2021

(30) Foreign Application Priority Data

Mar. 26, 2018  (KR) ........................ 10-2018-0034673
Sep. 28, 2018  (KR) ........................ 10-2018-0116319

(51) Int. Cl.
*H01L 21/00*     (2006.01)
*G01R 31/26*    (2020.01)
(Continued)

(52) U.S. Cl.
CPC .......... *H01L 22/22* (2013.01); *G01R 31/2635* (2013.01); *H01L 22/34* (2013.01);
(Continued)

(58) Field of Classification Search
CPC ..... H01L 22/22; H01L 22/34; H01L 25/0753; H01L 33/62; H01L 33/0093; H01L 2933/0066; H01L 33/0095; G01R 31/2635
See application file for complete search history.

(56) References Cited

U.S. PATENT DOCUMENTS 6,275,051 B1 *  8/2001  Bachelder .......... G01R 31/2863
                                              324/756.07
6,301,121 B1   10/2001  Lin
(Continued)

FOREIGN PATENT DOCUMENTS

JP      2004245669 A      9/2004
KR      20110118616 A     10/2011
(Continued)

OTHER PUBLICATIONS

International Search Report issued in International Application No. PCT/KR2019/003119 dated Jul. 19, 2019 (2 pages).
(Continued)

*Primary Examiner* — Ismail A Muse
(74) *Attorney, Agent, or Firm* — Osha Bergman Watanabe & Burton LLP

(57) ABSTRACT

Disclosed in the present specification are an apparatus and a method capable of quickly verifying a plurality of micro LEDs. An LED verification substrate according to the present specification is a micro LED verification substrate having a plurality of verification chips, wherein each verification chip can comprise: a first contact deposited on the upper side of a lower substrate; a first passivation layer deposited
(Continued)

on the upper side of the first contact; a second contact deposited on the upper side of the first passivation layer; a second passivation layer deposited on the upper side of the second contact; a first bump electrically connected to the first contact and protruding above the upper surface of the second passivation layer; and a second bump electrically connected to the second contact and protruding above the upper surface of the second passivation layer.

8 Claims, 8 Drawing Sheets

(51) Int. Cl.
  *H01L 21/66* (2006.01)
  *H01L 25/075* (2006.01)
  *H01L 33/62* (2010.01)
  *H01L 33/00* (2010.01)

(52) U.S. Cl.
  CPC .......... *H01L 25/0753* (2013.01); *H01L 33/62* (2013.01); *H01L 33/0093* (2020.05); *H01L 2933/0066* (2013.01)

(56) References Cited

U.S. PATENT DOCUMENTS

| | | | |
|---|---|---|---|
| 7,948,252 B2* | 5/2011 | Grube | G01R 31/2886 324/754.07 |
| 2003/0011377 A1 | 1/2003 | Oohata et al. | |
| 2013/0099812 A1* | 4/2013 | Wang | G01R 31/2889 324/755.01 |
| 2017/0141278 A1* | 5/2017 | Hamaguchi | H01L 33/644 |
| 2017/0179360 A1* | 6/2017 | Miyoshi | H01L 33/486 |
| 2018/0269234 A1* | 9/2018 | Hughes | H01L 25/0753 |
| 2019/0081200 A1* | 3/2019 | Ting | H01L 24/03 |
| 2021/0148536 A1* | 5/2021 | Roels | F21S 41/143 |

FOREIGN PATENT DOCUMENTS

| | | |
|---|---|---|
| KR | 20120020857 A | 3/2012 |
| WO | 2017037475 A1 | 3/2017 |

OTHER PUBLICATIONS

Written Opinion issued in International Application No. PCT/KR2019/003119 dated Jul. 19, 2019 (5 pages).

* cited by examiner

MICRO LED VERIFICATION SUBSTRATE, MANUFACTURING METHOD THEREFOR, AND MICRO LED VERIFICATION METHOD USING SAME

TECHNICAL FIELD

The present invention relates to verification of micro light-emitting diodes (LEDs), and more specifically, to a technique for rapidly verifying a plurality of micro LEDs to find defective chips.

BACKGROUND ART

Micro light-emitting diode (LED) chips are very small LEDs with a size of 80 dim or less in general. In a process of generating a plurality of micro LED chips on a semiconductor wafer and then transferring the micro LED chips to desired substrates, there are difficulties as follows.

In the case of mass transfer using a stamp, there is an advantage in that a transfer speed is high but there is a disadvantage in that all chips are transferred regardless of distinguishing defective chips (dead chips). Therefore, there is a need for a process in which defective chips are removed from a substrate to which chips are finally transferred and empty spaces are re-filled with normal chips.

In the case of individual transfer in which chips are transferred one by one, there is an advantage in that the most accurate transfer is possible because defective chips can be filtered but there is a disadvantage in that actually applying the individual transfer is impossible because a speed is too slow.

There is a need for a transfer method having all the advantages of mass transfer and individual transfer.

PRIOR-ART DOCUMENTS

[Patent Document]
(Patent Document 1) Korean Patent Application Publication No. 10-2011-0118616, Published on Oct. 31, 2011

DISCLOSURE

Technical Problem

The present invention is directed to providing an apparatus and method for rapidly verifying a plurality of micro light-emitting diodes (LEDs).

Objects of the present invention are not limited to the above-mentioned objects and other objects which are not mentioned will be clearly understood by those skilled in the art from the following description.

Technical Solution

One aspect of the present invention provides a light-emitting diode (LED) verification substrate, which is a micro LED verification substrate including a plurality of verification chips. Each of the verification chips includes a first contact deposited on an upper side of a lower substrate, a first passivation layer deposited on an upper side of the first contact, a second contact deposited on an upper side of the first passivation layer, a second passivation layer deposited on an upper side of the second contact, a first bump which is electrically connected to the first contact and protrudes above an upper surface of the second passivation layer, and a second bump which is electrically connected to the second contact and protrudes above an upper surface of the second passivation layer.

The first bump may be electrically connected to the first contact through a first region in which a portion of the first passivation layer, a portion of the second contact, and a portion of the second passivation layer are etched, and the second bump may be electrically connected to the second contact through a second region in which a portion of the second passivation layer excluding the first region is etched.

The first region may have a greater area than the second region.

The second passivation layer may be further deposited on side surfaces of the second contact in the first region.

Another aspect of the present invention provides a method of manufacturing a micro LED verification substrate, which is a method of manufacturing a micro LED verification substrate including a plurality of verification chips. The method includes the steps of (a) depositing a first contact on an upper side of a lower substrate, (b) depositing a first passivation layer on an upper side of the first contact, (c) placing a first photoresist having a first shape on an upper side of the first passivation layer, (d) depositing a second contact on an upper side of the first photoresist and on the upper side of the first passivation layer that is not covered by the first photoresist, (e) removing the first photoresist and depositing a second passivation layer on an upper side of the second contact, (f) placing a second photoresist having a second shape on an upper side of the second passivation layer, (g) etching a region exposed by the second photoresist until the first contact is exposed to the outside, (h) removing the second photoresist and placing a third photoresist having a third shape, (i) etching a region exposed by the third photoresist until the second contact is exposed to the outside, and (j) electrically connecting a first bump and a second bump to the first contact and the second contact, respectively, which are exposed to the outside.

Still another aspect of the present invention provides a method of verifying a micro LED, which is a method of verifying a plurality of micro LED chips using a micro LED verification substrate including a plurality of verification chips. The method includes the steps of (a) wafer-bonding an upper portion of a micro LED verification substrate and an upper portion of a micro LED substrate including a plurality of micro LED chips, (b) removing a lowermost substrate of the micro LED substrate, (c) applying power to a first contact and a second contact of the micro LED verification substrate, and (d) removing LED chips that do not emit light, i.e., dead chips, from among the plurality of micro LED chips.

The step (b) may include removing the lowermost substrate by laser lift-off (LLQ), wherein the lowermost substrate is a sapphire substrate.

The step (d) may include performing individual transfer of the dead chips.

The method may further include (e) transferring the plurality of micro LED chips, from which the dead chips are removed, using a stamp.

In this case, the method may further include, (f) when empty portions are present due to the dead chips in a region in which stamp transfer is performed, repairing the empty portions by individual transfer of normal chips.

Other specific details of the present invention are included in the detailed description and accompanying drawings.

Advantageous Effects

According to an aspect of the present specification, it is possible to rapidly verify a plurality of micro light-emitting diodes (LEDs).

According to another aspect of the present specification, chips are transferred in large quantities using a stamp after defective chips are removed, and thus a speed can be improved and quality can also be improved as compared to the related art.

Effects of the present invention are not limited to the above-mentioned effects and other effects which are not mentioned will be clearly understood by those skilled in the art from the following description.

MODES OF THE INVENTION

Figure 1:
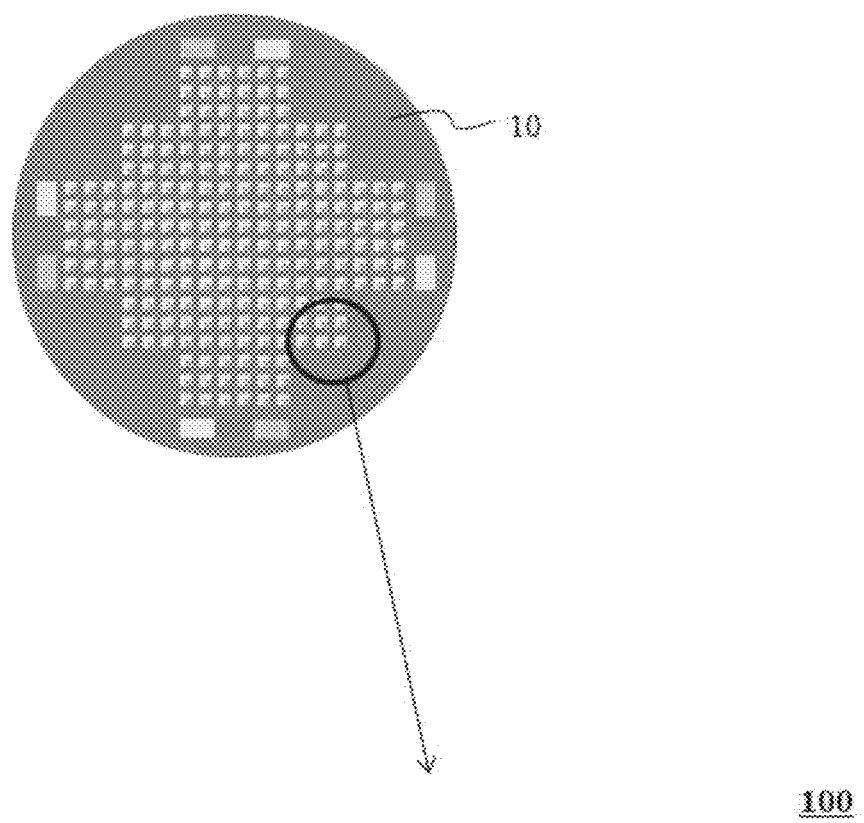
FIG. 1 illustrates a view of a micro light-emitting diode (LED) verification substrate and an enlarged cross-sectional view of a verification chip according to the present specification.
Figure 1:
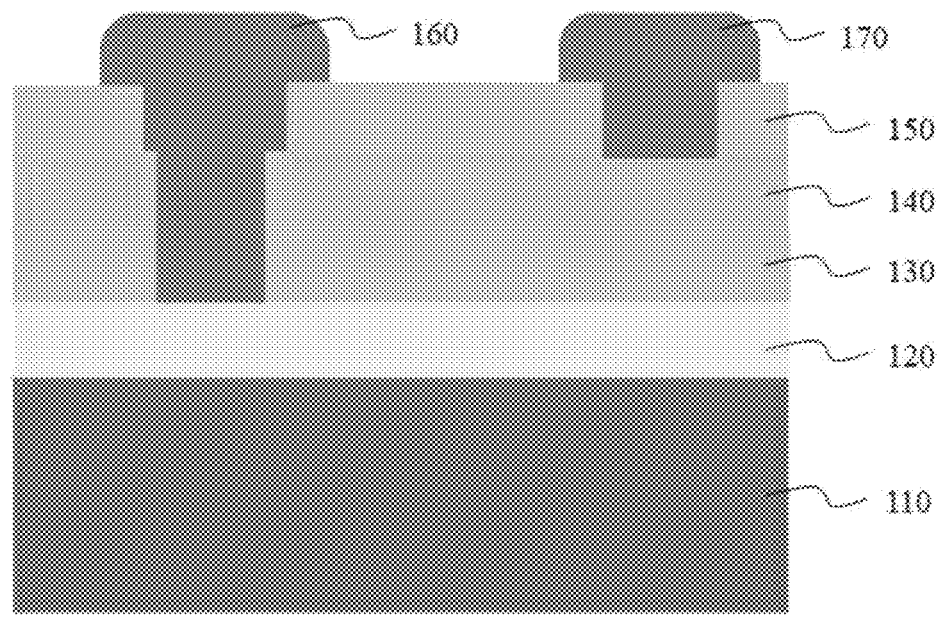

Hereinafter, advantages and features of the present invention and methods of achieving the same will be clearly understood with reference to the accompanying drawings and the following detailed embodiments. However, the present invention is not limited to embodiments to be disclosed but may be implemented in various different forms. The embodiments are provided in order to complete the present disclosure and fully explain the scope of the present invention to those skilled in the art to which the present invention belongs. The scope of the present invention is defined by the appended claims.

The terms used herein are provided to only describe the embodiments of the present invention and not for purposes of limitation. Unless the context clearly indicates otherwise, the singular forms include the plural forms. It will be understood that the terms "comprise" or "comprising," when used herein, do not preclude the presence or addition of one or more other elements other than the mentioned elements. Like reference numerals indicate like elements throughout the specification. The tell "and/or" includes any and all combinations of one or more referents. It will be understood that, although the terms "first," "second," etc. may be used herein to describe various elements, these elements should not be limited by these terms. These terms are only used to distinguish one element from another element. Therefore, a first element described below may be a second element within the technological scope of the present invention.

Unless otherwise defined, all terms (including technical and scientific terms) used herein can be used as is customary in the art to which this invention belongs. Also, it will be further understood that terms, such as those defined in commonly used dictionaries, will not be interpreted in an idealized or overly formal sense unless expressly so defined herein.

The spatially-relative terms such as "below," "beneath," "lower," "above," and "upper" may be used herein for ease of description to describe the relationship of one element or components with another element(s) or component(s) as illustrated in the drawings. The spatially-relative terms should be understood to include different directions of the element when being used or operating, in addition to the direction illustrated in the drawing. For example, when the element in the drawings is turned over, elements described as "below" or "beneath" other elements would then be oriented "above" the other elements. Therefore, an exemplary term "below" may encompass both an orientation of above and below. Elements may be arranged in different directions so that spatially-relative terms may be interpreted according to the arrangement.

Hereinafter, embodiments of the present invention will be described in detail with reference to the accompanying drawings.

FIG. 1 illustrates a view of a micro light-emitting diode (LED) verification substrate and an enlarged cross-sectional view of a verification chip according to the present specification.

Referring to FIG. 1, it can be confirmed that a micro LED verification substrate 10 according to the present specification is provided. The micro LED verification substrate 10 according to the present specification may include a plurality of verification chips 100.

FIG. 1 illustrates an enlarged cross-sectional view of the verification chip 100 according to the present specification. The verification chip 100 according to the present specification may include a first contact 120 deposited on an upper side of a lower substrate 110, a first passivation layer 130 deposited on an upper side of the first contact 120, a second contact 140 deposited on an upper side of the first passivation layer 130, a second passivation layer 150 deposited on an upper side of the second contact 140, a first bump 160, and a second bump 170. In order to facilitate understanding of the verification chip 100 according to the present specification, first, a method of manufacturing a micro LED verification substrate according to the present specification will be described.

Figure 2:
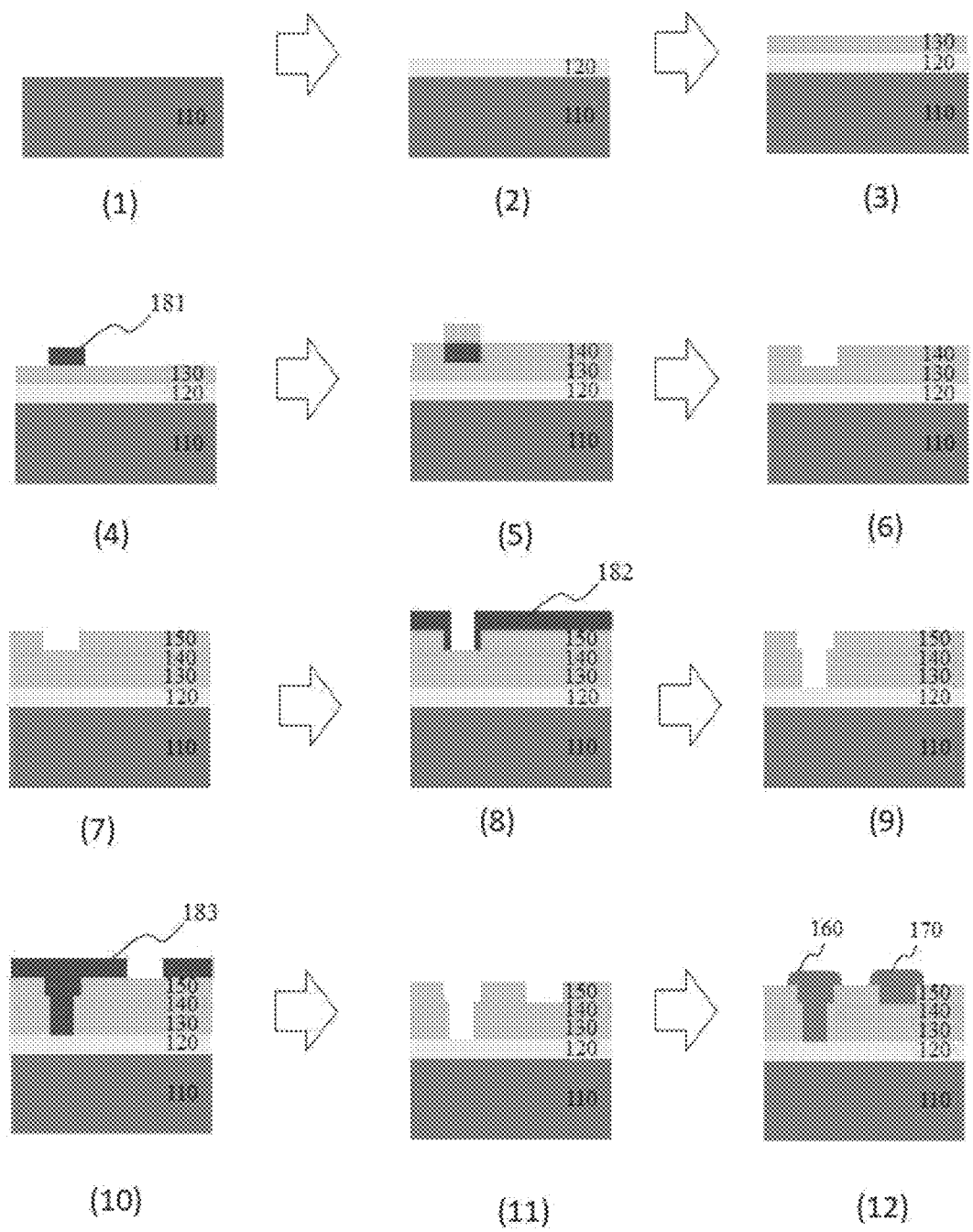
FIG. 2 illustrates views for describing a method of manufacturing a micro LED verification substrate according to an embodiment of the present specification.

FIG. 2 illustrates views for describing a method of manufacturing a micro LED verification substrate according to an embodiment of the present specification.

Referring to FIG. 2, first, a lower substrate 110 is provided (1). Next, a first contact 120 may be deposited on an upper side of the lower substrate 110 (2). According to an embodiment of the present specification, the first contact 120 may be gold (element symbol: Au). Next, a first passivation layer 130 may be deposited on an upper side of the first contact 120 (3). Next, a first photoresist 181 having a first shape may be placed on an upper side of the first passivation layer 130 (4). Next, a second contact 140 may be deposited on an upper side of the first photoresist 181 and the upper side of the first passivation layer 130 that is not covered by the first photoresist (5). According to an embodiment of the present specification, the first contact 120 may be gold (element symbol: Au). Next, the first photoresist 181 may be removed (6). After the first photoresist 181 is removed, a second passivation layer 150 may be deposited on an upper side of the second contact 140 (7). Next, a second photoresist 182 having a second shape may be placed on an upper side of the second passivation layer 150 (8). Next, etching a region exposed by the second photoresist 182 may be performed until the first contact 120 is exposed to the outside (9). Next, after the second photoresist 182 is removed, a third photoresist 183 having a third shape may be placed (10). Next, etching a region exposed by the third photoresist 183 may be performed until the second contact 140 is exposed to the outside (11). Next, a first bump 160 and a second bump 170 may be electrically connected to the first contact 120 and the second contact 140, respectively, which are exposed to the outside (12).

Figure 3:
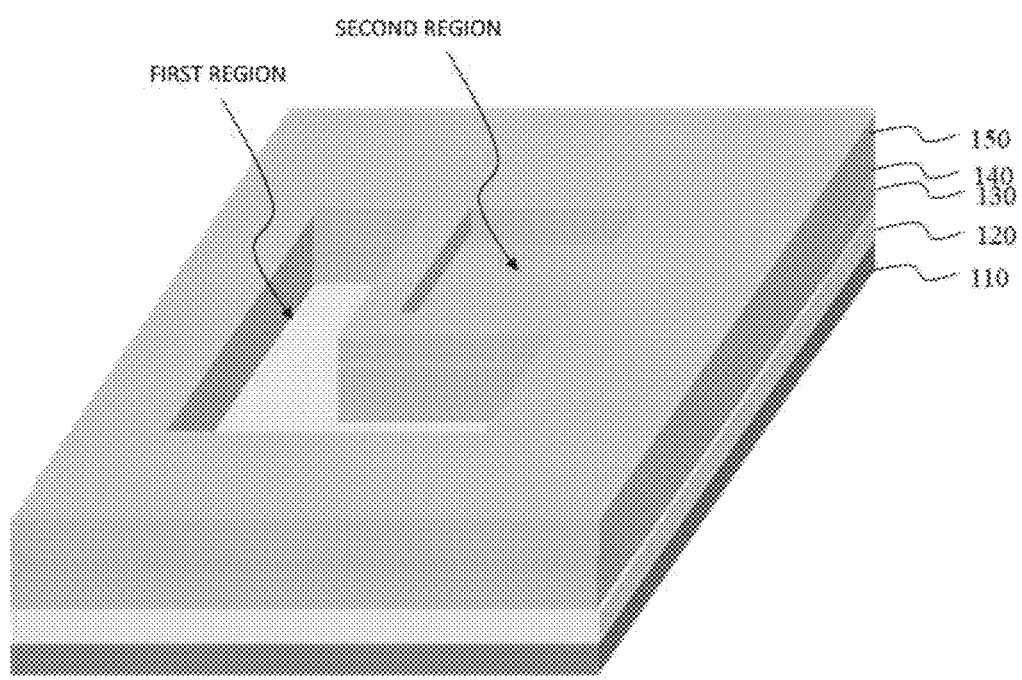
FIG. 3 is a perspective view illustrating a first contact and a second contact which are exposed to the outside by being etched two times in manufacturing of a micro LED verification substrate according to an embodiment of the present specification.

FIG. 3 is a perspective view illustrating a first contact and a second contact which are exposed to the outside by being etched two times in manufacturing of a micro LED verification substrate according to an embodiment of the present specification.

FIG. 3 illustrates a state before a first bump 160 and a second bump 170 are connected to the first contact 120 and the second contact 140 and corresponds to the step 11 of FIG. 2. In the present specification, a region in which a portion of the first passivation layer 130, a portion of the second contact 140, and a portion of the second passivation layer 150 are etched is referred to as a "first region." That is, the first region refers to a region in which a portion exposed by a second photoresist 182 is etched. In the present specification, a region in which a portion of the second passivation layer 150 excluding the first region is etched is referred to as a "second region." That is, the second region refers to a region in which a portion exposed by a third photoresist 183 is etched. According to an embodiment of the present specification, the first bump 160 may be electrically connected to the first contact 120 through the first region, and the second bump 170 may be electrically connected to the second contact 140 through the second region. In this case, the first region may have a greater area than the second region.

Meanwhile, the second passivation layer 150 may be further deposited on side surfaces of the second contact 140 in the first region. Referring to FIGS. 1 and 2, it can be seen that the second passivation layer 150 is deposited on the side surfaces of the second contact 140 in the first region. However, in FIG. 3, the side surfaces of the second contact 140 in the first region are illustrated as being exposed, but this is for convenience of understanding the first region and is not contrary to FIGS. 1 and 2.

Meanwhile, referring again to FIGS. 1 and 2, the first bump 160 may protrude above an upper surface of the second passivation layer 150, and the second bump 170 may protrude above an upper surface of the second passivation layer.

Hereinafter, a method of verifying a micro LED chip using the above-described micro LED verification substrate will be described with reference to FIGS. 4 to 7. However, in describing the method of verifying the micro LED chip according to the present specification, repetitive descriptions of the configurations of the micro LED verification chip and the micro LED verification substrate described above will be omitted.

First, an upper portion of a micro LED verification substrate and an upper portion of a micro LED substrate including a plurality of micro LED chips may be wafer-bonded. Next, the lowermost substrate of the micro LED substrate may be removed.

According to an embodiment of the present specification, the lowermost substrate may be a sapphire substrate and may be removed by laser lift-off (LLO).

Figure 4:
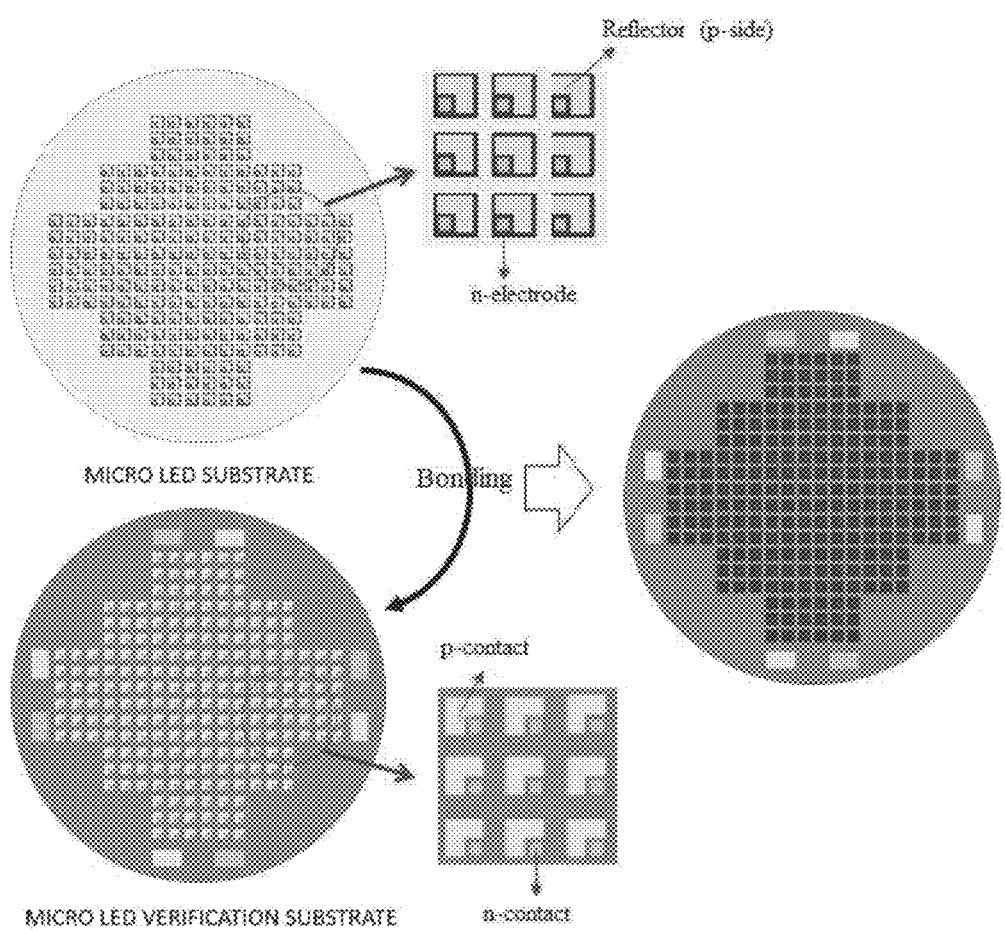
FIG. 4 is a reference diagram for wafer bonding.

FIG. 4 is a reference diagram for wafer bonding.

Referring to FIG. 4, it can be confirmed that a micro LED verification substrate and a micro LED substrate according to the present specification are provided. The micro LED substrate includes a plurality of LED chips, and the micro LED verification substrate according to the present specification also includes a plurality of verification chips. The number of verification chips is preferably identical to the number of LED chips, but the number of verification chips may be greater than the number of LED chips. A position of the verification chip preferably corresponds to a position in one-to-one correspondence with the verification chip when an upper portion of the micro LED verification substrate and an upper portion of the micro LED substrate are wafer-bonded.

Figure 5:
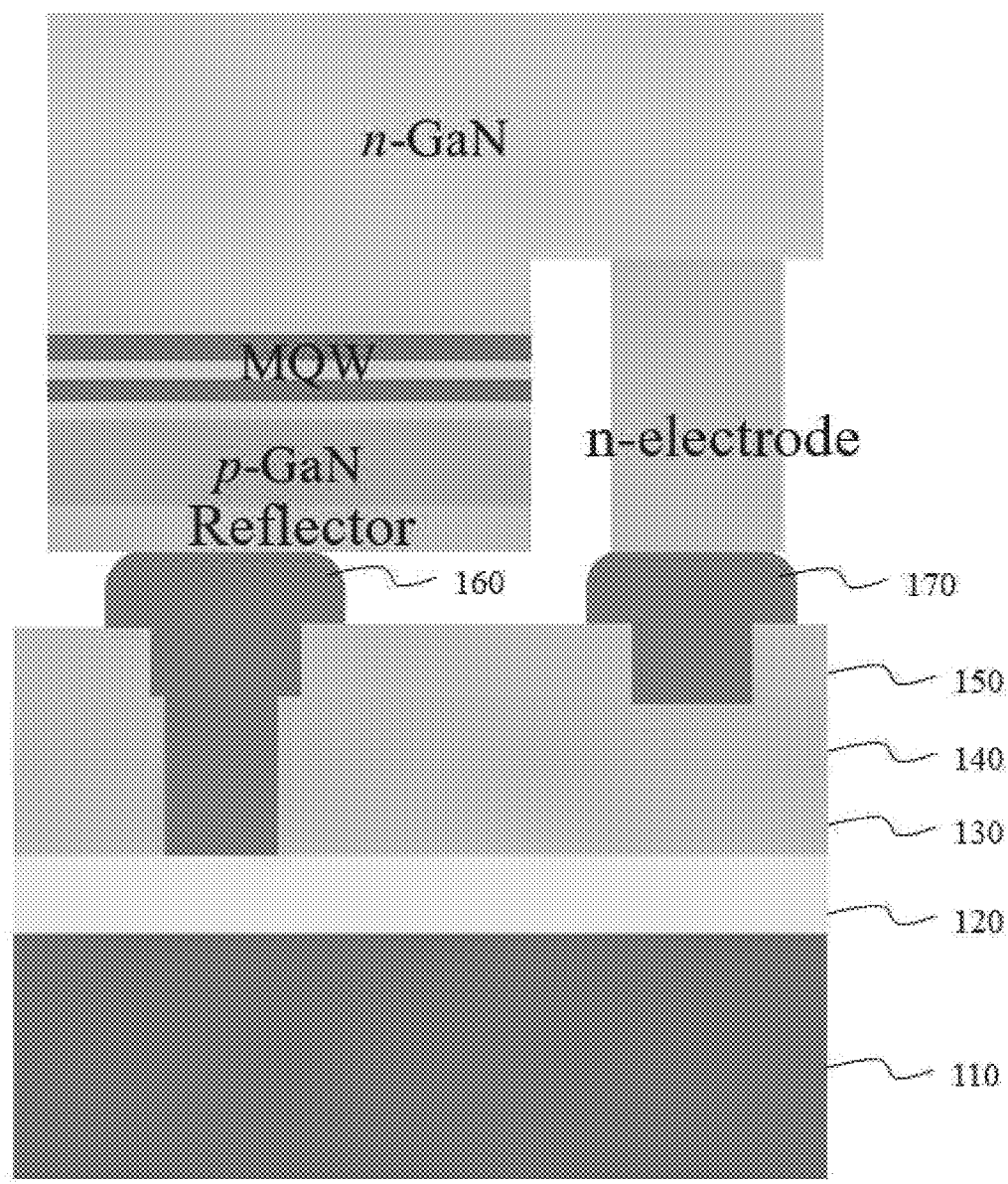
FIG. 5 is a cross-sectional view illustrating a verification chip and a micro LED which are in contact with each other when wafer bonding is performed.

FIG. 5 is a cross-sectional view illustrating a verification chip and a micro LED which are in contact with each other when wafer bonding is performed.

Referring to FIG. 5, it can be seen that a first bump 160 serving as a P-connector and a second bump 170 serving as an N-connector are in contact with an N-terminal and a reflector (representing a P-terminal) of a micro LED, respectively. Through the above first and second bumps 160 and 170, each of LED chips and each of verification chips are electrically connected.

Next, power may be applied to a first contact 120 and a second contact 140 of a micro LED verification substrate.

Figure 6:
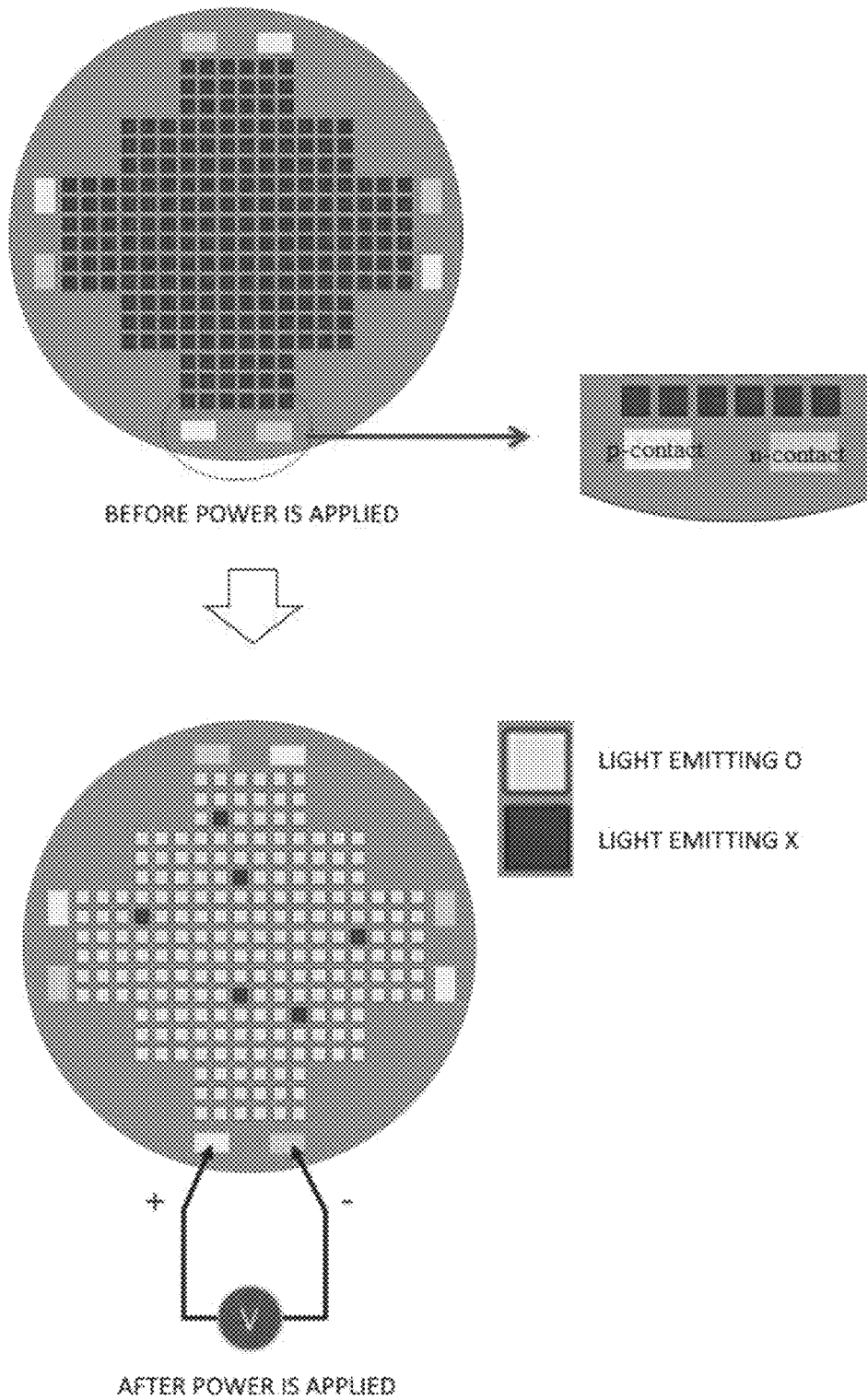
FIG. 6 is a view of an example in which power is applied to a micro LED verification substrate.

FIG. 6 is a view of an example in which power is applied to the micro LED verification substrate.

Referring to FIG. 6, on the micro LED verification substrate, external electrodes electrically connected to the first contacts 120 and the second contacts 140 included in all the verification chips may be formed. When power is applied through the external electrode, the power is supplied to the micro LEDs. In this case, all normal chips emit light, but defective chips do not emit light. Defective chips, so called "dead chips," may be identified by whether the chips emit light or not.

Next, dead chips may be removed from among the plurality of micro LED chips.

Figure 7:
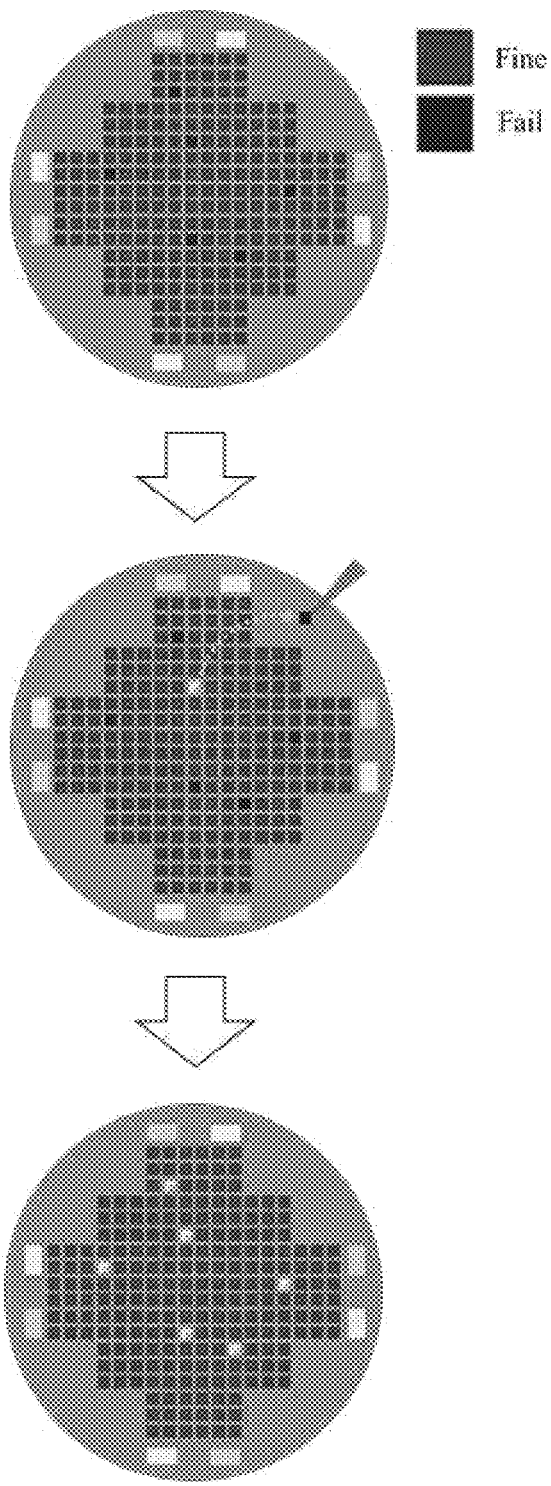
FIG. 7 is a view of an example in which dead chips are removed.

FIG. 7 is a view of an example in which dead chips are removed.

Referring to FIG. 7, it can be confirmed that chips identified as dead chips are removed. According to an embodiment of the present specification, the dead chips may be removed by an individual transfer method.

Figure 8:
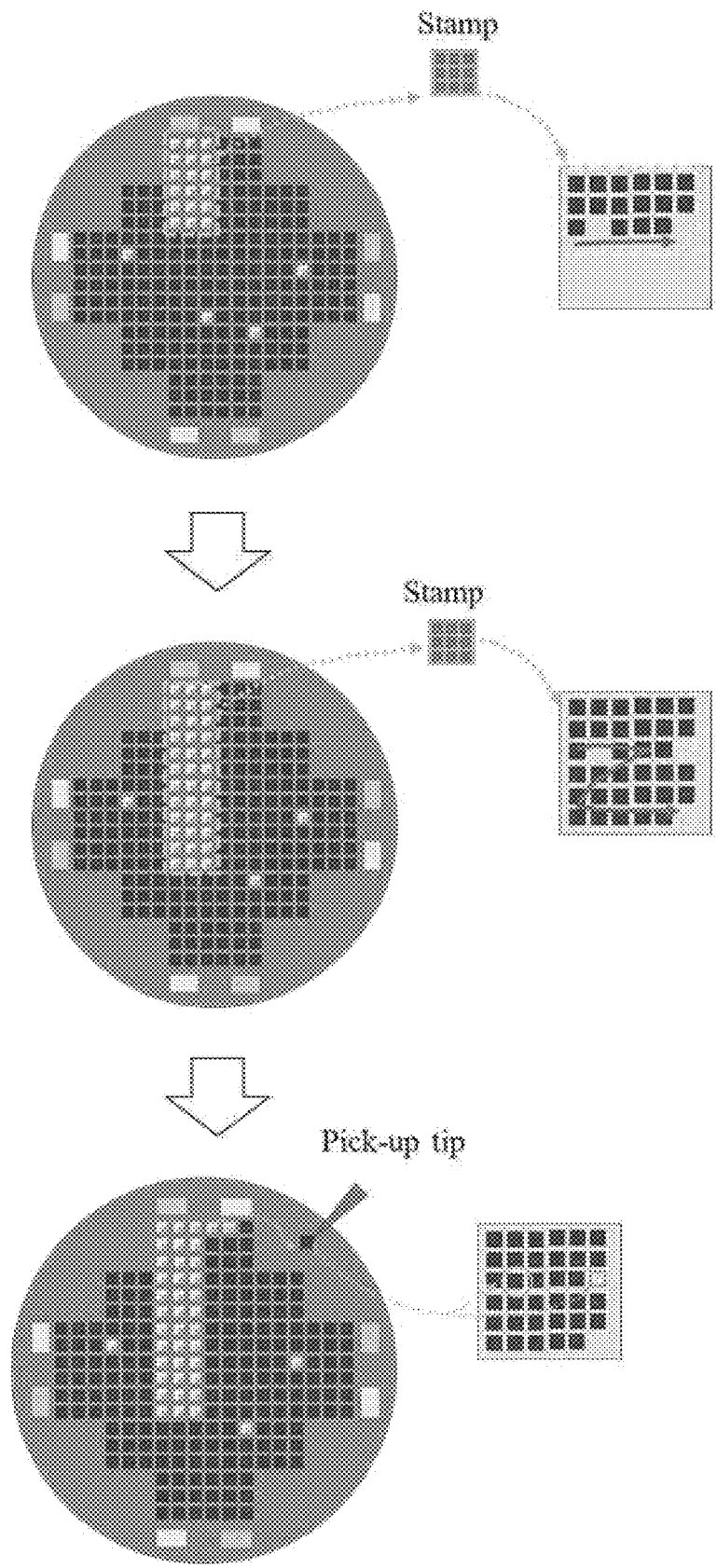
FIG. 8 is a reference diagram of repair being performed by stamp transfer and individual transfer according to the present specification.

FIG. 8 is a reference diagram of repair being performed by stamp transfer and individual transfer according to the present specification.

Referring to FIG. 8, a method of verifying a micro LED according to the present specification may further include transferring the plurality of micro LED chips, from which dead chips are removed, using a stamp. Thereafter, when empty portions are present due to the dead chips in a region in which stamp transfer is performed, the method may further include repairing the empty portions by individual transfer of normal chips. By using the above method, accuracy through individual transfer and rapidity through stamp transfer may be simultaneously achieved.

While the embodiments of the present invention have been described with reference to the accompanying drawings, it will be understood by those skilled in the art that various modifications can be made without departing from the scope of the present invention and without changing essential features. Therefore, the above-described embodiments should be considered in a descriptive sense only and not for purposes of limitation.

REFERENCE NUMERALS

10: micro LED verification substrate
100: verification chips
110: lower substrate
120: first contact
130: first passivation layer
140: second contact
150: second passivation layer
160: first bump
170: second bump
181: first photoresist
182: second photoresist
183: third photoresist

The invention claimed is:

1. A micro light-emitting diode (LED) verification substrate, which is a micro LED verification substrate including a plurality of verification chips, wherein each of the verification chips includes:
   a first contact deposited on an upper side of a lower substrate;
   a first passivation layer deposited on an upper side of the first contact;
   a second contact deposited on an upper side of the first passivation layer;
   a second passivation layer deposited on an upper side of the second contact;
   a first bump which is electrically connected to the first contact and protrudes above an upper surface of the second passivation layer; and
   a second bump which is electrically connected to the second contact and protrudes above an upper surface of the second passivation layer;
   wherein:
   the first bump is electrically connected to the first contact through a first region in which a portion of the first passivation layer, a portion of the second contact, and a portion of the second passivation layer are etched; and
   the second bump is electrically connected to the second contact through a second region in which a portion of the second passivation layer excluding the first region is etched.

2. The micro LED verification substrate of claim 1, wherein the first region has a greater area than the second region.

3. The micro LED verification substrate of claim 1, wherein the second passivation layer is further deposited on side surfaces of the second contact in the first region.

4. A method of manufacturing a micro light-emitting diode (LED) verification substrate, which is a method of manufacturing a micro LED verification substrate including a plurality of verification chips, the method comprising the steps of:
   (a) depositing a first contact on an upper side of a lower substrate;
   (b) depositing a first passivation layer on an upper side of the first contact;
   (c) placing a first photoresist having a first shape on an upper side of the first passivation layer;
   (d) depositing a second contact on an upper side of the first photoresist and on the upper side of the first passivation layer that is not covered by the first photoresist;
   (e) removing the first photoresist and depositing a second passivation layer on an upper side of the second contact;
   (f) placing a second photoresist having a second shape on an upper side of the second passivation layer;
   (g) etching a region exposed by the second photoresist until the first contact is exposed to the outside;
   (h) removing the second photoresist and placing a third photoresist having a third shape;
   (i) etching a region exposed by the third photoresist until the second contact is exposed to the outside; and
   (j) electrically connecting a first bump and a second bump to the first contact and the second contact, respectively, which are exposed to the outside.

5. A method of verifying a micro light-emitting diode (LED), which is a method of verifying a plurality of micro LED chips using a micro LED verification substrate including a plurality of verification chips, the method comprising the steps of:
   (a) wafer-bonding an upper portion of a micro LED verification substrate and an upper portion of a micro LED substrate including a plurality of micro LED chips;
   (b) removing a lowermost substrate of the micro LED substrate by laser lift-off (LLO), wherein the lowermost substrate is a sapphire substrate;
   (c) applying power to a first contact and a second contact of the micro LED verification substrate; and
   (d) removing LED chips that do not emit light, i.e., dead chips, from among the plurality of micro LED chips.

6. The method of claim 5, wherein the step (d) includes performing individual transfer of the dead chips.

7. The method of claim 5, further comprising (e) transferring the plurality of micro LED chips, from which the dead chips are removed, using a stamp.

8. The method of claim 7, further comprising, (f) when empty portions are present due to the dead chips in a region in which stamp transfer is performed, repairing the empty portions by individual transfer of normal chips.

* * * * *